United States Patent
Quintin

(10) Patent No.: US 11,501,045 B2
(45) Date of Patent: *Nov. 15, 2022

(54) METHOD FOR ANALYZING A SIMULATION OF THE EXECUTION OF A QUANTUM CIRCUIT

(71) Applicant: BULL SAS, Les Clayes-sous-Bois (FR)

(72) Inventor: Jean Noël Quintin, Bezons (FR)

(73) Assignee: BULL SAS, Les Clayes-Sous-Bois (FR)

( * ) Notice: Subject to any disclaimer, the term of this patent is extended or adjusted under 35 U.S.C. 154(b) by 300 days.

This patent is subject to a terminal disclaimer.

(21) Appl. No.: 16/723,267

(22) Filed: Dec. 20, 2019

(65) Prior Publication Data
US 2020/0249968 A1    Aug. 6, 2020

(30) Foreign Application Priority Data
Dec. 20, 2018   (FR) ..................... 1873620

(51) Int. Cl.
*G06F 30/3308* (2020.01)
*G06N 10/00* (2022.01)
*G06F 9/455* (2018.01)

(52) U.S. Cl.
CPC .......... *G06F 30/3308* (2020.01); *G06F 9/455* (2013.01); *G06N 10/00* (2019.01)

(58) Field of Classification Search
CPC .............. G06N 10/00; G01R 31/31705; G06F 11/3457; G06F 30/3308; G06F 9/455
See application file for complete search history.

(56) References Cited

U.S. PATENT DOCUMENTS

| | | | |
|---|---|---|---|
| 7,113,967 B2 * | 9/2006 | Cleve | G06N 10/00 257/14 |
| 7,383,235 B1 * | 6/2008 | Ulyanov | B82Y 10/00 706/13 |
| 9,477,796 B2 * | 10/2016 | Garcia-Ramirez | G06F 30/20 |
| 9,791,258 B2 * | 10/2017 | Mower | G06N 10/00 |
| 9,858,531 B1 * | 1/2018 | Monroe | G06F 15/76 |
| 11,169,801 B2 * | 11/2021 | Cao | G06N 10/00 |

(Continued)

FOREIGN PATENT DOCUMENTS

| | | |
|---|---|---|
| CN | 101930395 A | 12/2010 |
| WO | WO2018172629 A1 | 9/2018 |
| WO | WO2019113600 A1 | 6/2019 |

OTHER PUBLICATIONS

Viamontes et al.; "High-performance QuIDD-based simulation of quantum circuits"; Proceedings Design, Automation and Test in Europe Conference and Exhibition; vol. 2 | Conference Paper | Publisher: IEEE (Year: 2004).*

(Continued)

*Primary Examiner* — Helen Rossoshek
(74) *Attorney, Agent, or Firm* — Meagher Emanuel Laks Goldberg & Liao, LLP

(57) ABSTRACT

A method for analyzing a simulation of the execution of a quantum circuit includes: a step of post-selecting one or more particular values of one or more qubits at one or more steps of the simulation; a step of setting filtration that sets the value of one or more quantum states of the quantum state vector(s) derived from the post-selection(s) of qubits; a step of analyzing the part of the simulation that corresponds to the post-selection(s) of qubits and to the quantum state vector(s) filtered.

19 Claims, 3 Drawing Sheets

(56) References Cited

U.S. PATENT DOCUMENTS

| | | | | |
|---|---|---|---|---|
| 11,170,137 | B1* | 11/2021 | Richardson | G06N 10/00 |
| 11,195,117 | B2* | 12/2021 | Monroe | G06N 10/00 |
| 2006/0224547 | A1* | 10/2006 | Ulyanov | B82Y 10/00 706/62 |
| 2008/0140749 | A1* | 6/2008 | Amato | B82Y 10/00 708/490 |
| 2017/0104493 | A1* | 4/2017 | Goto | H01L 39/223 |
| 2017/0228483 | A1* | 8/2017 | Rigetti | G06N 7/04 |
| 2018/0046933 | A1* | 2/2018 | La Cour | G06N 10/00 |
| 2018/0262276 | A1* | 9/2018 | Bishop | H04B 10/70 |
| 2018/0349605 | A1* | 12/2018 | Wiebe | G06N 10/00 |
| 2019/0042677 | A1* | 2/2019 | Matsuura | G06F 30/20 |
| 2019/0179730 | A1 | 6/2019 | Geller et al. | |
| 2020/0104739 | A1* | 4/2020 | Sharma | G06N 10/00 |
| 2020/0116623 | A1* | 4/2020 | Cooper-Roy | G01N 21/6404 |
| 2020/0184031 | A1* | 6/2020 | Horii | G06N 10/00 |
| 2020/0213276 | A1* | 7/2020 | Luongo | G06F 17/16 |
| 2020/0380397 | A1* | 12/2020 | Quintin | G06F 11/3457 |
| 2021/0103692 | A1* | 4/2021 | Allouche | G06F 30/33 |
| 2021/0232960 | A1* | 7/2021 | Scott N. | G06N 5/003 |
| 2021/0374595 | A1* | 12/2021 | Cao | G06F 15/16 |
| 2022/0029625 | A1* | 1/2022 | Gidney | H03K 19/003 |

OTHER PUBLICATIONS

Nikahd et al.; "OWQS: One-Way Quantum Computation Simulator"; Euromicro Conference on Digital System Design; Conference Paper | Publisher: IEEE (Year: 2012).*

Héctor et al.; "Simulation of Quantum Circuits via Stabilizer Frames"; IEEE Transactions on Computers; vol. 64, Issue: 8 | Journal Article | Publisher: IEEE (Year: 2015).*

Berta et al.; "Entanglement Cost of Quantum Channels"; IEEE Transactions on Information Theory; vol. 59, Issue: 10 | Journal Article | Publisher: IEEE; Cited by: Papers (41) (Year: 2013).*

Berta et al.; "Identifying the Information Gain of a Quantum Measurement"; IEEE Transactions on Information Theory; vol. 60, Issue: 12 | Journal Article | Publisher: IEEE; Cited by: Papers (29) (Year: 2014).*

Correspondence from the French National Institute of Industrial Property Office (INPI—Institute National De La Propriété Industrielle) for FR1873620 dated Oct. 7, 2019; Preliminary Research Report of the French National Institute of Industrial Property Office for FR1873620 dated Sep. 26, 2019; and Written Opinion on the Patentability of the Invention issued by the French National Institute of Industrial Property Office for FR1873620.

Michielsen, K., De Raedt, H., 'QCE: A Simulator for Quantum Computer Hardware', 2003, Turkish Journal of Physics, vol. 27, No. 5, pp. 343-370.

Anonymous, 'Breakpoint—Wikipedia', URL:https://en.Wikipedia.org/w/index.php?title=Breakpoint&oldid=804797949, 2017, pp. 1-4.

Nguyen, A.Q., 'Building an effective general-purpose quantum simulator for the design and analysis of quantum circuits', 2006, ProQuest Information and Learning Company, Doctoral Dissertation, pp. 1-120.

Steiger, D.S., Haener, T., Troyer, M., 'ProjectQ: An Open Source Software Framework for Quantum Computing', 2016, Quantum 2, Cornell University Library, pp. 1-11, https://arxiv.org/abs/1612.08091v2, DOI 10.22331/q-2018-01-31-49.

Li, Y., Ying, M., 'Debugging quantum processes using monitoring measurements', 2014, Physical Review A 89 (Atomic, Molecular, and Optical Physics), vol. 89, No. 4, pp. 042338-1-042338-6, doi: 10.1103/physreva.89.042338.

Anticoli, L., Piazza, C., Taglialegne, L., Zuliana, P., 'Verifying Quantum Programs: From Quipperto QPMC', 2017, Cornell University Library, pp. 1-18, https://arxiv.org/abs/1708.06312v1.

Svore, K.M., Geller, A., Troyer, M., Azariah, J., Granade, C., Heim, B., Kliuchnikov, V., Mykhailova, M., Paz, A., Roetteler, M., 'Q#: Enabling scalable quantum computing and development with a high-level domain-specific language', 2018, Cornell University Library, pp. 1-11, https://arxiv.org/abs/1803.00652v1, DOI 11.1145/3183895.3183901.

* cited by examiner

METHOD FOR ANALYZING A SIMULATION OF THE EXECUTION OF A QUANTUM CIRCUIT

CROSS-REFERENCE TO RELATED APPLICATIONS

This application claims the benefit of French Patent Application No. 1873620 filed Dec. 20, 2018, the disclosure of which is herein incorporated by reference in its entirety.

TECHNICAL FIELD

The invention falls within the field of methods for analyzing simulations of the execution of a quantum circuit.

PRIOR ART

For such an analysis, it is known to repetitively perform a very large number of simulations, in order to obtain the values of all possible quantum states.

It is also known to take intermediate measurements when simulating the execution of the quantum circuit.

TECHNICAL PROBLEM

These known solutions do not enable a good compromise between simplifying the analysis of the execution of a quantum circuit and the completeness of the analysis performed.

SUMMARY OF THE INVENTION

The invention at least partially remedies the shortcomings of the prior art and improves the compromise mentioned above.

Thus, according to the invention, it may be beneficial both to be able to track the execution of that quantum circuit step-by-step and also to take measurements in various execution operations of that quantum circuit without substantially disrupting the execution of that quantum circuit, in order to facilitate the analysis of the execution of that quantum circuit while preserving the usefulness of that analysis, i.e. without any disruptions in the execution of that quantum circuit, particularly due to measurements, harming the usefulness of the analysis of that quantum circuits execution, making it either useless or less useful, thereby leading to a substantially less effective debugging of the execution of that quantum circuit.

To achieve this good compromise between substantially simplifying the analysis of the execution of that quantum circuit and that analysis being very useful, the invention proposes a particular combination of a post-selection and a setting filtration, both performed on a simulated execution rather than an actual execution.

The method therefore enables the analyst of the execution of the quantum circuit to focus on a part of the execution of the quantum circuit that interests him or her and on the type of process for that execution part, increasing the options to debug the quantum circuit.

DISCLOSURE OF THE INVENTION

A method is proposed for analyzing a simulation of the execution of a quantum circuit, comprising:
a step of post-selecting one or more particular values of one or more qubits at one or more steps of the simulation,
a step of setting filtration that sets the value of one or more quantum states of the quantum state vector(s) derived from the post-selection(s) of qubits.
a step of analyzing the part of said simulation that corresponds to the post-selection(s) of qubits and to the quantum state vector(s) filtered.

According to another aspect, a method is proposed for analyzing a simulation of the execution of a quantum circuit, comprising:
a step of post-selecting one or more particular values once the measurement of one or more qubits is output,
a step of analyzing the part of said simulation that corresponds to the post-selection(s) of qubits.

The features described in the following paragraphs may optionally be implemented. They may be implemented independently of one another, or in combination with one another:

Preferably, the method comprises, between the post-selection step and the analysis step:
a step of retrieving, by an iterator, all or some of the quantum states of the quantum state vector(s) derived from the post-selection(s) of qubits.

Thus, it involves being able to analyze the execution of a quantum circuit, particularly for the purposes of debugging that quantum circuit. To do so, according to the invention, it will be beneficial both to be able to track the execution of that quantum circuit step-by-step and also to extract in a simple and complete manner, one which is transparent to the analyst of the execution of that quantum circuit, all or some of the values of quantum state vectors for certain qubits of particular interest to that analyst, all in order to facilitate both the focusing on the part of the execution of that quantum circuit considered to be particularly interesting, while thereafter facilitating the extraction of data related to that part of the execution, the analysis of the execution of the quantum circuit while preserving the completeness of that analysis, i.e. without losing or sacrificing any or all of the quantum states considered interesting by the analyst, which could damage the completeness of the analysis and/or the running of the analysis, potentially leading to a substantially less effective debugging of the execution of that quantum circuit. To achieve this good compromise between substantially doubly simplifying the analysis of the execution of that quantum circuit and ensuring the completeness of that analysis, the invention proposes a particular combination of a post-selection and a quantum iteration, both performed on a simulated execution rather than an actual execution. The invention enables the analyst of the execution of the quantum circuit to easily and effectively focus on the part of the execution of that quantum circuit that interests him or her, all while making the extraction of the interesting data obtained simpler or more transparent to him or her, hence providing a precise focus on what interests him or her, with a simpler way to extract only what interests him or her. Likewise, the great simplification achieved through the use of a quantum iterator enables the user to carry out more numerous and more detailed post-selection operations, without making the time spent or the difficulty of analysis prohibitive.

Preferably, the method comprises, between the post-selection step and the analysis step, and after the step of setting filtration:
a step of retrieving, by a quantum iterator, all or some of the quantum states of the quantum state vector(s) derived from the post-selection(s) of qubits.

This makes it possible to retrieve a quantum state vector that has been filtered beforehand. The analysis of the quantum state vector may thereby take place immediately after that quantum state vector has been retrieved, without requiring any additional operations on that quantum state vector.

Preferably, the method comprises a step of identifying each quantum state of said quantum state vector(s) and a parameter representative of a probability that is respectively associated with said each quantum state, located between the step of post-selection and the step of retrieval, the step of retrieval further comprising the retrieval of each parameter representative of the probability respectively associated with each quantum state.

The iterator therefore makes it possible to extract additional information about the quantum state vector, in a simple and unsupervised manner. This makes it possible to further improve the completeness of the analysis of the execution.

Preferably, the step of post-selecting one or more particular values of one or more qubits is carried out at the output of the measurement of said qubit(s).

As the intermediate measurements or the final measurement are an integral part of the execution, the post-selection step may advantageously be performed after one of those measurements. This makes it possible to analyze the simulation step-by-step.

Preferably, the step of post-selecting one or more particular values of one or more qubits is carried out after a quantum gate operation on said qubit(s).

Thus, knowing the sequence of operations during execution, the post-selection step may be performed at any time during execution. This enables a complete, non-degraded analysis of the quantum states deemed interesting at any moment in the simulation.

Preferably, the method comprises:

a step of communicating quantum states of one or more quantum state vectors between a simulator in which those quantum states are stored and an application terminal in which those quantum states will be analyzed, as those quantum states are communicated in multiple installments, with the quantity of data communicated in each one not exceeding the size of a buffer memory, that buffer memory size being less than the size of the memory storing those quantum states in the simulator, preferably at least 10 times smaller, and preferentially at least 100 times smaller.

This enables a very sizable memory gain, especially in the application terminal, whose memory may be fairly limited.

Preferably, the size of the buffer memory, in the application terminal and in the simulator, is large enough for the time taken to process the contents of that buffer memory by the application terminal to be longer than the time taken to transfer the data communicated between the simulator and the application terminal.

This sizable memory gain does not or almost does not come at the cost of any slowdown in processing the data within the application terminal.

Preferably, the size of the buffer memory is between 1 MB and 100 MB, and very preferably between 3 MB and 20 MB.

The memory range is thereby optimized for a compromise between memory gain and preserving processing speed.

Preferably, the step of analysis is followed by a step of debugging the execution of the quantum circuit.

This therefore enables a beneficial application of the analysis step, improving the quality and efficiency of the analyzed quantum circuit.

Preferably, the method comprises, between the post-selection step and the analysis step:

a step of threshold filtration, setting a probability threshold below which the corresponding quantum states are removed from the quantum state vector to which they belong, and/or a step of value filtration, selecting a value of a quantum state for which the corresponding quantum states are kept in the quantum state vector.

Multiple filtration steps may therefore be performed on the quantum state vector. The filtering of the quantum states of the quantum state vector based on the various parameters makes it possible to further increase the completeness of the analysis, by focusing on the quantum states deemed interesting. The various types of filtration may be combined and/or stacked with one another.

Preferably, the method comprises, after the setting filtration step:

a step of renormalizing the quantum state vector, so that the sum of the probabilities of the quantum states kept in that quantum state vector is still equal to 1.

The step of renormalizing makes it possible to have a coherent filtered quantum state vector, particularly when quantum states of the quantum state vector were removed from the quantum state vector during one of the filtration steps. The setting filtration step corresponds to an operation of measuring certain qubits of which the value of the one or more qubits is chosen a priori after the measurement.

Preferably, the method is integrated into an application programming interface (API) capable of accessing a server including a quantum circuit execution simulator and a module for communicating with a remote application terminal separate from the simulator.

This makes it possible to improve ease of use for a user-analyst from their application terminal.

Preferably, the number of qubits in the quantum circuit is between 2 and 1000, and preferably between 10 and 50.

The analysis method of the invention operates the same with large quantum circuits, or with very large ones.

Preferably, the analysis method is implemented in python language.

The language python is well-suited to this type of method for analyzing the operation of a quantum circuit.

The invention and variants thereof may generally make it possible to propose a method for analyzing a simulation of the execution of a quantum circuit, enabling a complete and simplified analysis, particularly for debugging the execution of the quantum circuit, and in particular for offering a better compromise between the simplification of the analysis of the execution of a quantum circuit and the relevance of the analysis performed.

Such a solution makes it possible to solve the problems posed by known solutions.

BRIEF DESCRIPTION OF THE DRAWINGS

Other features, details, and benefits of the invention will become apparent upon reading the detailed description below and upon analyzing the attached drawings, in which.

DESCRIPTION OF THE EMBODIMENTS

Figure 1:
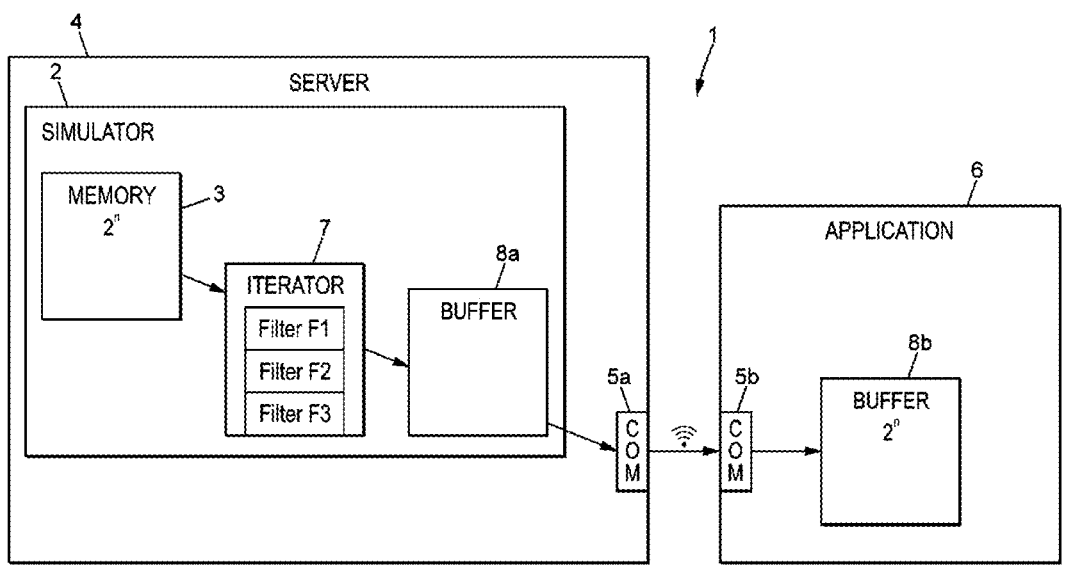
FIG. 1 shows a system making it possible to implement a method for analyzing a simulation of the execution of a quantum circuit according to one embodiment of the invention.

Reference is now made to FIG. 1, in which an example system 1 making it possible to implement a method for analyzing the execution of a simulation of a quantum circuit is illustrated. The system may comprise a computer, i.e. said method may be computer-implemented.

The system 1 particularly comprises a simulator 2 of a quantum circuit. More specifically, the simulator 2 makes it possible to simulate a quantum processor.

As an output of the simulator 2, a quantum state vector is obtained. The quantum state vector comprises $2^n$ quantum states, n being the number of qubits that the simulation relies upon.

For example, the quantum state vector comprises between $2^2$ and $2^{1000}$. In other words, the quantum circuit comprises between 2 and 1000 qubits. Preferably, the quantum state vector comprises, for example, between $2^{10}$ and $2^{50}$. In other words, the quantum circuit comprises between 10 and 50 qubits.

The simulator 2 comprises, for example, a memory 3. The memory 3 may particularly be able to store the quantum state vector obtained. The memory 3 therefore comprises a large storage capacity in order to be able to store a quantum state vector comprising between $2^2$ and $2^{1000}$, and preferably between $2^{10}$ and $2^{50}$ possible quantum states.

The simulator 2 is, for example, stored on a server 4.

The server 4 comprises, for example, a communication module 5, making it possible to enter into communication with an application terminal 6 via a communication module 5b of the application terminal 6.

The application terminal 6 is, for example, remote from the server 4. The application terminal 6 particularly enables an analyst to access the quantum state vector in order to analyze it without storing it.

To that end, an iterator 7 may be implemented within the system 1. The iterator 7 enables an interaction between the application terminal 6 and the simulator 2.

More specifically, the iterator 7 makes it possible to avoid duplicating all the information; in other words, the quantum state vector obtained at the output of the simulator 2, to the application terminal 6. In other words, the iterator 7 enables the retrieval of the information at the output of the simulator 2, on the application terminal 6. The iterator 7 therefore enables an analyst to access the information at the output of the simulator 2 in a simple way.

More specifically, the iterator 7 loops onto each quantum state of the quantum state vector obtained at the output of the simulator 2, so that each quantum state can be retrieved on the application terminal.

The iterator 7 may further comprise filters F1, F2, and F3 to be applied to the quantum state vector. Those filters are described in greater detail with reference to FIG. 2.

Furthermore, the system 1 may comprise a buffer memory 8a implemented in the simulator 2, and a buffer memory 8b implemented in the application terminal 6.

The information obtained at the output of the simulator 2 is for example transmitted to the application terminal 6 by means of the iterator 7, via the buffer memories 8a, 8b.

The iterator 7 is stored in the simulator 2 and is in communication with the buffer memory 8a.

The use of buffer memories 8a, 8b makes it possible to greatly reduce the memory size needed to access the information obtained at the output of the simulator 2.

The size of the buffer memories 8a, 8b may be chosen so that the time taken to process the content of the buffer memory 8b by the application terminal 6 is greater than the time taken to transfer the information obtained at the output of the simulator 2 to the application terminal 6.

Thus, the size of the buffer memories 8a, 8b may be chosen to be 1 MB and 100 MB, and preferably between 3 MB and 20 MB.

The result is that the size of the buffer memories 8a, 8b is at least 10 times, and preferably at least 100 times smaller than the memory 3 storing the information obtained at the output of the simulator 2.

Thus, at the end of the simulation, a quantum state vector $2^n$ is obtained. The quantum state vector $2^n$ is stored in the memory 3 of the simulator 2. The memory 3 communicates with the iterator 7. More specifically, the memory 3 transmits sections of the quantum state vector 2n to the iterator 7. The iterator 7 is configured to process those sections of the quantum state vector $2^n$, particularly by means of the filters F1, F2, and F3. The iterator 7 is configured to send sections of the quantum state vector to the buffer memory 8a of the simulator 2 which transmits them, via the communication interfaces 5a, 5b, to the application terminal 6. The buffer memory 8b of the application terminal 6 receives the sections of the quantum state vector, so that they can be analyzed by an analyst directly on the application terminal. Communication between the server 4 and the application terminal 6 is, for example, done by radio waves or over the Internet.

According to one variant embodiment, the iterator 7 is stored within the buffer memory 8a of the simulator 2.

Figure 2:
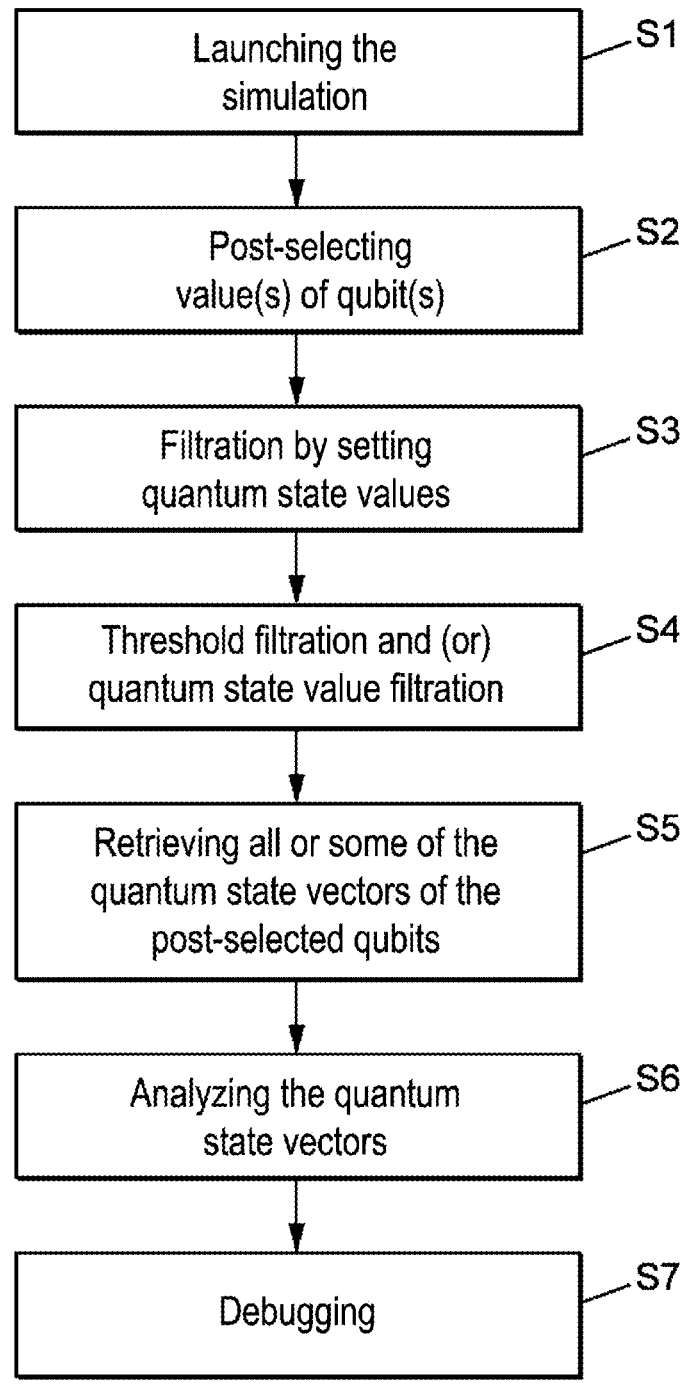
FIG. 2 shows a flowchart illustrating the main steps of the method for analyzing a simulation of the execution of a quantum circuit according to one embodiment of the invention.

FIG. 2 depicts the main steps of a method for simulating the execution of a quantum circuit according to one example embodiment.

During the step of simulation S1, the simulation of the quantum circuit is launched. When simulating the execution of a quantum circuit, the quantum state vector obtained is made up of a plurality of qubits having a quantum state 0 and 1.

Figure 3:
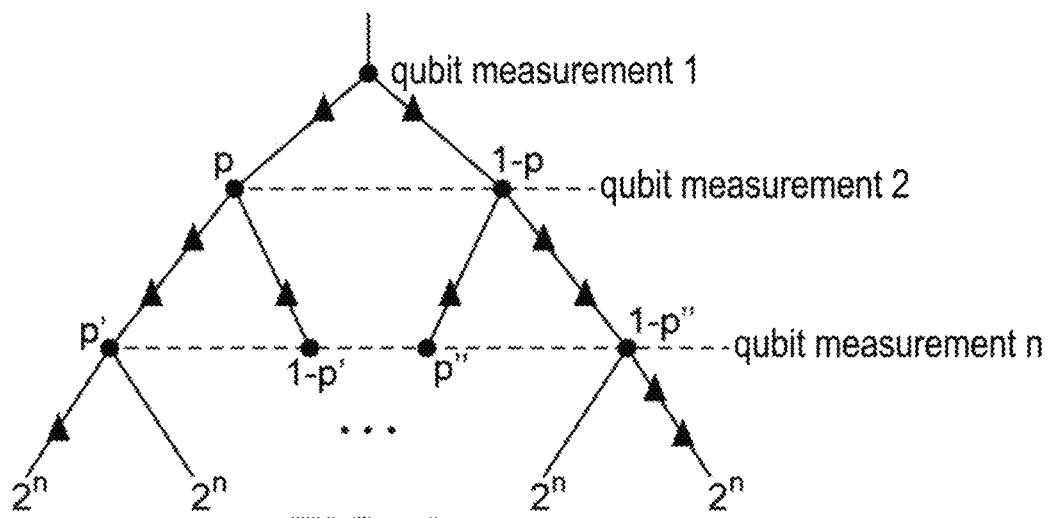
FIG. 3 shows an example flow of the execution on a quantum state vector according to one example embodiment.

With reference to FIG. 3, the quantum states of the qubits of the quantum state vector are not known. A probability is associated with each quantum state of a qubit, with the sum of the probabilities being equal to 1.

Thus, when the qubit 2 is measured, a probability p is associated with one of the two quantum states 0 or 1, and a probability p−1 is associated with the other quantum state 0 or 1.

With each measurement, a new probability is associated with each quantum state 0 or 1 of the measured qubits.

Thus, when the qubit n is measured, a probability p is associated with one of the two quantum states 0 or 1 for the first qubit, and a probability 1-$p$ is associated with the other one of the two quantum states 0 or 1. Likewise, for the nth qubit, a probability p is associated with one of the two quantum states 0 or 1 of the nth qubit, and a probability 1-$p$ is associated with the other one of the two quantum states 0 or 1 of the nth qubit.

The probabilities p, p and p are generally different, but may, in some cases, be equal.

During the simulation, intermediate measurements are taken for each qubit. Those intermediate measurements influence the quantum state of the measured qubits, leading to a qubit to be set to a quantum state between 0 and 1.

The simulation therefore makes it possible to obtain an execution tree, illustrated in FIG. 3, in which the nodes represent each qubit of the quantum state vector. Following the intermediate measurements taken on the qubits, two branches depart from each node: each branch representing a quantum state of the measured qubit with which its probability is associated.

At the end of the execution, a plurality of quantum state vectors, comprising $2^n$ quantum states, is obtained.

The triangles symbolize quantum operations that can be carried out on qubits. Quantum operations include, for example, applying quantum gates to the qubits, which may or may not modify the values of the qubits.

In the step of post-selection S2, one or more particular values of one or more qubits are post-selected at one or more steps of the simulation. Particular value means a particular quantum state.

In other words, it is possible to post-select one or more branches of the execution. More specifically, it is possible to post-select a quantum state from one or more qubits at the time of execution.

Post-selection may amount to choosing the values of the quantum states of the quantum state vector.

For a given simulation, the post-selections of values of qubits may be successive. The post-selections may also be repetitive. For example, it is possible to post-select the same qubit value several times. For example, it is possible to post-select different values for the same qubit several times. For example, it is possible to select different values of different qubits several times.

In the remainder of the description, the term post-selection is used, although multiple post-selections may be performed, as described above.

Post-selection is performed at multiple steps of the simulation. For example, post-selection is performed at the output of the measurement of the qubits.

Post-selection is performed following a quantum gate operation on the qubit.

Next, a setting filtration step S3 is carried out. The setting filtration step sets the value of one or more quantum states of the quantum state vector(s) derived from post-selection(s) of qubits.

The terms quantum state vector derived from post-selection(s) of qubits and quantum state vector of the post-selected qubit(s) are used interchangeably in the remainder of the description.

The setting filtration step S3 is, for example, performed by the iterator 7, and particularly by applying the filter F1 depicted in FIG. 1.

The setting filtration step S3 is, for example, located between the step of post-selection S2 and the step of retrieval S5, described below.

The setting filtration step S3 particularly comprises the setting of quantum state values of the quantum state vector derived from post-selection.

The setting filtration step particularly enables the iterator 7 to not need to browse the entire quantum state vector derived from post-selection of qubits when it is retrieved on the application terminal 6.

More specifically, if out of one quantum state vector derived from post-selection of qubits of n quantum states, three quantum states are set during the setting filtration step, a vector of size $2^{n-3}$ is retrieved by means of the iterator 7, rather than a quantum vector of size $2^n$ as before.

The setting filtration step therefore further makes it possible to reduce the size of the information to be transmitted to the application terminal.

According to one embodiment, an additional filtration step S4 is performed.

The additional filtration step S4 is implemented by the iterator 7.

For example, the additional filtration step S4 may comprise threshold filtration and/or value filtration of the quantum states of the quantum state vector derived from the post-selection of qubits.

Threshold filtration particularly comprises the defining of a probability threshold for which the quantum states associated with a probability that fall below that threshold are not retained.

Threshold filtration is performed by applying the filter F2 illustrated in FIG. 1.

Value filtration particularly comprises the defining of a quantum state value for which the quantum states of the quantum state vector derived from post-selection of qubits having that value are not retrieved.

Value filtration is performed by applying the filter F3 illustrated in FIG. 1.

This additional step of filtration S4 makes it possible both to reduce the size of the information to be sent to the application terminal 6 by eliminating certain quantum states of the quantum state vector derived from post-selecting qubits, and to increase the completeness of the analysis by focusing only on the quantum states deemed interesting.

The filtration types may be combined and/or stacked for multiple quantum states of the quantum state vector.

According to one embodiment, the steps of setting filtration S3 and additional filtration S4 may be followed by a step of renormalizing the filtered quantum state vector, during which the probability of each quantum state saved in the filtered quantum state vector is modified so that the sum of the probabilities of each quantum state is equal to 1.

Next, a step of retrieval S5, by the iterator 7, of all or some of the quantum states of the quantum state vector(s) derived from the post-selection of qubits and filtered is carried out.

The step of retrieval S5 may also comprise the retrieval, by the iterator 7, of all or some of the quantum states of the quantum state vectors derived from the post-selection of qubits and derived from the different types of filtration, described with reference to the steps of setting filtration S3 and additional filtration S4.

The step of retrieval S5 may further comprise the retrieval of each of the probabilities associated with each quantum state of the retrieved quantum state vector, whether renormalized or not.

In particular, the iterator 7 is able to identify a parameter representative of the probability of each quantum state of the quantum state vector, between the step of post-selection and the step of retrieval, for example before the step of setting filtration.

The iterator 7 is, for example, able to read the quantum state vector, and to associate a probability with each quantum state. The iterator is further able, based on a complex model of the matrix stabilizer type, to recalculate the elements of the matrix in order to put them into the form of a readable quantum state vector and to associate a probability with each quantum state of that quantum state vector.

The iterator 7 is configured to iterate on each of the quantum states of the quantum state vector obtained after step S4, and potentially on the probabilities associated with them, so that an analyst can access it from the application terminal 6 for a step of analysis S6.

The step of analysis S6 comprises, for example, the comparison of the quantum states of the quantum state vector retrieved with the quantum states of the quantum state vector expected following the steps of post-selection S2 and setting filtration S3.

In the step of debugging S7, the data from the analysis may be used for the purposes of debugging the execution of the quantum circuit.

The method is implemented on an application programming interface (or API) that can access the server 4.

In one variant, the threshold filtration particularly comprises the defining of a probability threshold for which the quantum states associated with a probability that fall above that threshold are not retained.

In one variant, the value filtration particularly comprises the defining of a quantum state value for which only the quantum states of the quantum state vector derived from post-selection of qubits having that value are retrieved.

INDUSTRIAL APPLICATION

The invention may have application particularly in the field of quantum computing and debugging the execution of quantum circuits.

The invention is not limited to the examples described above, which are only given as examples, but rather encompasses all variants that a person skilled in the art may envision within the scope of the protection sought.

LIST OF REFERENCE SIGNS

1: System
2: quantum simulator
3: memory
4: server
5: communication interface
6: application terminal
7: iterator
8a, 8b: buffer memories
S1: step of simulation
S2: step of post-selection
S3: step of setting filtration
S4: step of additional filtration
S5: step of retrieval
S6: step of analysis
S7: step of debugging

The invention claimed is:

1. A computer-implemented method for analyzing a simulation of the execution of a quantum circuit, comprising:
   post-selecting (S2) one or more particular values of one or more qubits at one or more steps of the simulation;
   setting filtration (S3) that sets the value of one or more quantum states of the quantum state vector(s) derived from the post-selection(s) of qubits;
   analyzing (S6) a part of said simulation that corresponds to the post-selection(s) of qubits and to the quantum state vector(s) filtered.

2. The computer-implemented method for analyzing a simulation of the execution of a quantum circuit according to claim 1, further comprising, between the step of post-selection (S2) and the step of analysis (S6), retrieving (S5), by an iterator (7), all or some of the quantum states of the quantum state vector(s) derived from the post-selection(s) of qubits.

3. The computer-implemented method for analyzing a simulation of the execution of a quantum circuit according to claim 2, further comprising, between the step of post-selection (S2) and the step of analysis (S6), and after the setting filtration step (S3) retrieving (S5), by a quantum iterator, all or some of the quantum states of the quantum state vector(s) derived from the post-selection(s) of qubits.

4. The computer-implemented method for analyzing a simulation of the execution of a quantum circuit according to claim 3, further comprising:
   identifying each quantum state of said quantum state vector(s) and a parameter representative of a probability that is respectively associated with said each quantum state, located between the step of post-selection (S2) and the step of retrieval (S5),
   wherein the step of retrieval (S5) further comprises retrieving each parameter representative of the probability respectively associated with each quantum state.

5. The computer-implemented method for analyzing a simulation of the execution of a quantum circuit according to claim 2, further comprising:
   identifying each quantum state of said quantum state vector(s) and a parameter representative of a probability that is respectively associated with said each quantum state, located between the step of post-selection (S2) and the step of retrieval (S5),
   wherein the step of retrieval (S5) further comprises retrieving each parameter representative of the probability respectively associated with each quantum state.

6. The computer-implemented method for analyzing a simulation of the execution of a quantum circuit according to claim 1, wherein the step of post-selecting (S2) one or more particular values of one or more qubits is carried out at the output of the measurement of said qubit(s).

7. The computer-implemented method for analyzing a simulation of the execution of a quantum circuit according to claim 1, wherein the step of post-selecting (S2) one or more particular values of one or more qubits is carried out after a quantum gate operation on said qubit(s).

8. The computer-implemented method for analyzing a simulation of the execution of a quantum circuit according to claim 1, further comprising:
   communicating quantum states of one or more quantum state vectors between a simulator (2) in which those quantum states are stored and an application terminal (6) in which those quantum states will be analyzed,
   wherein the quantum states are communicated in multiple installments, with the quantity of data communicated in each one not exceeding the size of a buffer memory (8a, 8b), that buffer memory (8a, 8b) size being less than the size of a memory (3) storing those quantum states in the simulator (2).

9. The computer-implemented method for analyzing a simulation of the execution of a quantum circuit according to claim 8, wherein the size of the buffer memory (8a, 8b), in the application terminal (6) and in the simulator (2) is large enough for the time taken to process the contents of that buffer memory (8a, 8b) by the application terminal (6) to be longer than the time taken to transfer the data communicated between the simulator (2) and the application terminal (6).

10. The computer-implemented method for analyzing a simulation of the execution of a quantum circuit according to claim 8, wherein the size of the buffer memory (8a, 8b) is between 1 MB and 100 MB.

11. The computer-implemented method for analyzing a simulation of the execution of a quantum circuit according to claim 10, wherein the size of the buffer memory (8a, 8b) is between 3 MB and 20 MB.

12. The computer-implemented method for analyzing a simulation of the execution of a quantum circuit according to claim 1, wherein the step of analyzing (S6) is followed by debugging (S7) the execution of the quantum circuit.

13. The computer-implemented method for analyzing a simulation of the execution of a quantum circuit according to claim 1, further comprising, between the step of post-selection (S2) and the step of analysis (S6):
   threshold filtration (S4) by setting a probability threshold below which the corresponding quantum states are removed from the quantum state vector to which they belong, and/or
   value filtration (S4) by selecting a value of a quantum state for which the corresponding quantum states are kept in the quantum state vector.

14. The computer-implemented method for analyzing a simulation of the execution of a quantum circuit according to claim 1, further comprising, following the step of setting filtration (S3), renormalizing the quantum state vector, so that the sum of the probabilities of the quantum states kept in that quantum state vector is still equal to 1.

15. The computer-implemented method for analyzing a simulation of the execution of a quantum circuit according to claim 1, wherein the method is integrated into an application programming interface (API) capable of accessing a server (4) including a quantum circuit execution simulator (2) and a module (5) for communicating with a remote application terminal (6) separate from the simulator (2).

16. The computer-implemented method for analyzing a simulation of the execution of a quantum circuit according to claim 1, wherein the number of qubits in the quantum circuit is between 2 and 1000.

17. The computer-implemented method for analyzing a simulation of the execution of a quantum circuit according to claim 16, wherein the number of qubits in the quantum circuit is between 10 and 50.

18. The computer-implemented method for analyzing a simulation of the execution of a quantum circuit according to claim 1, further comprising:
   communicating quantum states of one or more quantum state vectors between a simulator (2) in which those quantum states are stored and an application terminal (6) in which those quantum states will be analyzed,
   wherein the quantum states are communicated in multiple installments, with the quantity of data communicated in each one not exceeding the size of a buffer memory (8a, 8b), that buffer memory (8a, 8b) size being less than the size of a memory (3) storing those quantum states in the simulator (2), at least 10 times smaller.

19. The computer-implemented method for analyzing a simulation of the execution of a quantum circuit according to claim 1, further comprising:
   communicating quantum states of one or more quantum state vectors between a simulator (2) in which those quantum states are stored and an application terminal (6) in which those quantum states will be analyzed,
   wherein the quantum states are communicated in multiple installments, with the quantity of data communicated in each one not exceeding the size of a buffer memory (8a, 8b), that buffer memory (8a, 8b) size being less than the size of a memory (3) storing those quantum states in the simulator (2), at least 100 times smaller.

* * * * *